US012727112B2

(12) United States Patent
Chen et al.

(10) Patent No.: US 12,727,112 B2
(45) Date of Patent: Sep. 1, 2026

(54) UNIVERSAL AIRFLOW IMPEDANCE BLANK WITH ADJUSTABLE VENTING RATIO

(71) Applicant: Dell Products L.P., Round Rock, TX (US)

(72) Inventors: Yi-Chang Chen, New Taipei City (TW); Ching-Yuan Wang, New Taipei City (TW); Liang-Chun Ma, Taipei City (TW); Ming-Hui Pan, New Taipei City (TW); MingHsueh Tsai, New Taipei City (TW); Chen Zhao, Wuxi City (CN)

(73) Assignee: Dell Products L.P., Round Rock, TX (US)

( * ) Notice: Subject to any disclaimer, the term of this patent is extended or adjusted under 35 U.S.C. 154(b) by 195 days.

(21) Appl. No.: 18/417,544

(22) Filed: Jan. 19, 2024

(65) Prior Publication Data

US 2025/0240908 A1 Jul. 24, 2025

(51) Int. Cl.
*H05K 7/20* (2006.01)
*H05K 5/02* (2006.01)

(52) U.S. Cl.
CPC ....... *H05K 7/20145* (2013.01); *H05K 5/0213* (2013.01)

(58) Field of Classification Search
CPC ........... H05K 7/20736; H05K 7/20145; H05K 7/20727; H05K 7/20836; H05K 7/20745; H05K 7/20172; H05K 7/20209; H05K 7/20136; H05K 7/20181; H05K 7/20; H01L 23/467
See application file for complete search history.

(56) References Cited

U.S. PATENT DOCUMENTS

| | | | | |
|---|---|---|---|---|
| 11,099,617 | B1 * | 8/2021 | Tunks | G06F 1/182 |
| 2006/0120038 | A1 * | 6/2006 | Lucero | G06F 1/20 361/694 |
| 2013/0128450 | A1 * | 5/2013 | Redshaw | G06F 1/20 73/861.47 |
| 2014/0342652 | A1 * | 11/2014 | Dong | H05K 7/20145 454/184 |
| 2014/0369002 | A1 * | 12/2014 | Takeuchi | H05K 7/20172 361/695 |
| 2016/0215999 | A1 * | 7/2016 | Bard | H05K 7/20736 |
| 2016/0262286 | A1 * | 9/2016 | Lin | H05K 7/20181 |
| 2016/0324037 | A1 * | 11/2016 | Dow | F24F 11/56 |
| 2016/0327062 | A1 * | 11/2016 | Amin-Shahidi | H05K 7/20736 |
| 2018/0359882 | A1 * | 12/2018 | Lovicott | H05K 7/20727 |
| 2019/0098795 | A1 * | 3/2019 | Adrian | H05K 7/20727 |
| 2024/0397661 | A1 * | 11/2024 | Yeh | H05K 7/20145 |

* cited by examiner

*Primary Examiner* — Adam B Dravininkas
(74) *Attorney, Agent, or Firm* — Jackson Walker L.L.P.

(57) ABSTRACT

An airflow impedance blank may be configured to populate a slot of an information handling system and may include a housing, which may include a plurality of venting holes, and a removable airflow impedance element configured to mechanically couple to the housing and further configured to be readily exchanged for another removable airflow impedance element to adjust a venting ratio of the airflow impedance blank.

20 Claims, 10 Drawing Sheets

UNIVERSAL AIRFLOW IMPEDANCE BLANK WITH ADJUSTABLE VENTING RATIO

TECHNICAL FIELD

The present disclosure relates to information handling systems, more specifically to a universal airflow impedance blank having an adjustable venting ratio.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM), hard disk drives, and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

Oftentimes, an information handling system chassis may be configured to receive a plurality of modular information handling resources, such as hard disk drives, in a corresponding plurality of externally-facing slots. In such a chassis, in traditional implementations, an airflow blank may sometimes be used to populate a slot not otherwise populated with an information handling resource in order to provide for desirable air flow of an air mover-based cooling system.

In design of such systems, a venting ratio of front and rear wall is a key factor in total air flow rate and air flow impedance in the information handling system. Some configurations may require lower venting ratios to prevent air flow bypass, while other configurations may desire higher venting ratios to enhance thermal performance. As a result, blanks with different venting ratios must be created to fulfill different configuration requirements, which often results in increased manufacturing costs and undesirable aesthetics.

SUMMARY

In accordance with the teachings of the present disclosure, the disadvantages and problems associated with traditional approaches to venting in an information handling system may be substantially reduced or eliminated.

In accordance with embodiments of the present disclosure, an airflow impedance blank may be configured to populate a slot of an information handling system and may include a housing, which may include a plurality of venting holes, and a removable airflow impedance element configured to mechanically couple to the housing and further configured to be readily exchanged for another removable airflow impedance element to adjust a venting ratio of the airflow impedance blank.

In accordance with embodiments of the present disclosure, an information handling system may include a chassis and an airflow impedance blank configured to populate a slot of the chassis. The airflow impedance blank may include a housing, which may include a plurality of venting holes, and a removable airflow impedance element configured to mechanically couple to the housing and further configured to be readily exchanged for another removable airflow impedance element to adjust a venting ratio of the airflow impedance blank.

In accordance with embodiments of the present disclosure, a method for forming an airflow impedance blank configured to populate a slot of an information handling system may include mechanically coupling a removable airflow impedance element to a housing, which may include a plurality of venting holes. The removable airflow element may be configured to be readily exchanged for another removable airflow impedance element to adjust a venting ratio of the airflow impedance blank.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4C, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more busses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
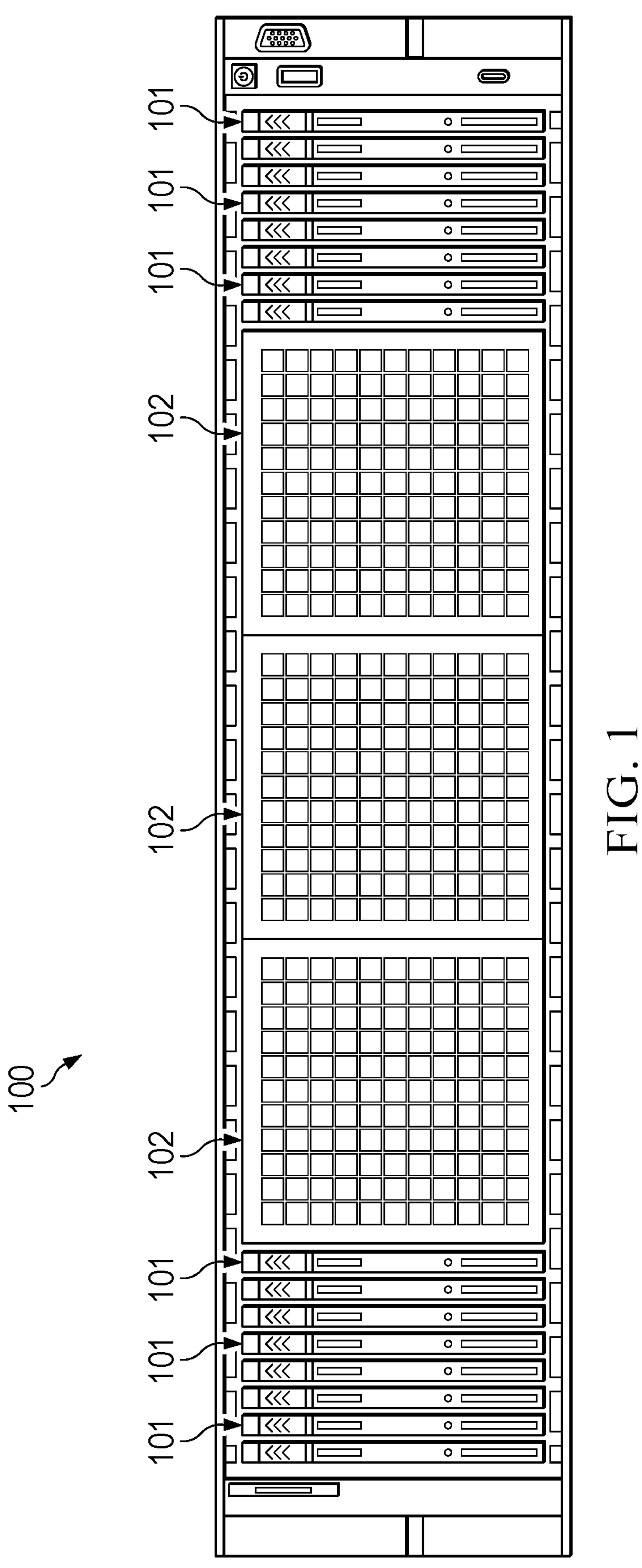
FIG. 1 illustrates an elevation view of an example information handling system chassis including example information handling resource carriers and example airflow impedance blanks, in accordance with embodiments of the present disclosure.

FIG. 1 illustrates an elevation view of an example information handling system chassis 100 for receiving modular information handling resources, in accordance with embodiments of the present disclosure. Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources.

As depicted in FIG. 1, chassis 100 may include one or more externally-facing slots, each configured to receive a corresponding information handling resource carrier 101 or an airflow impedance blank 102 in any suitable location. As described in greater detail below, each airflow impedance blank 102 may be configured to have an adjustable venting ratio capable of fulfilling different system thermal conditions. As shown in FIG. 1, each airflow impedance blank 102 may include a plurality of venting holes for passage and guidance of airflow.

Figure 2A:
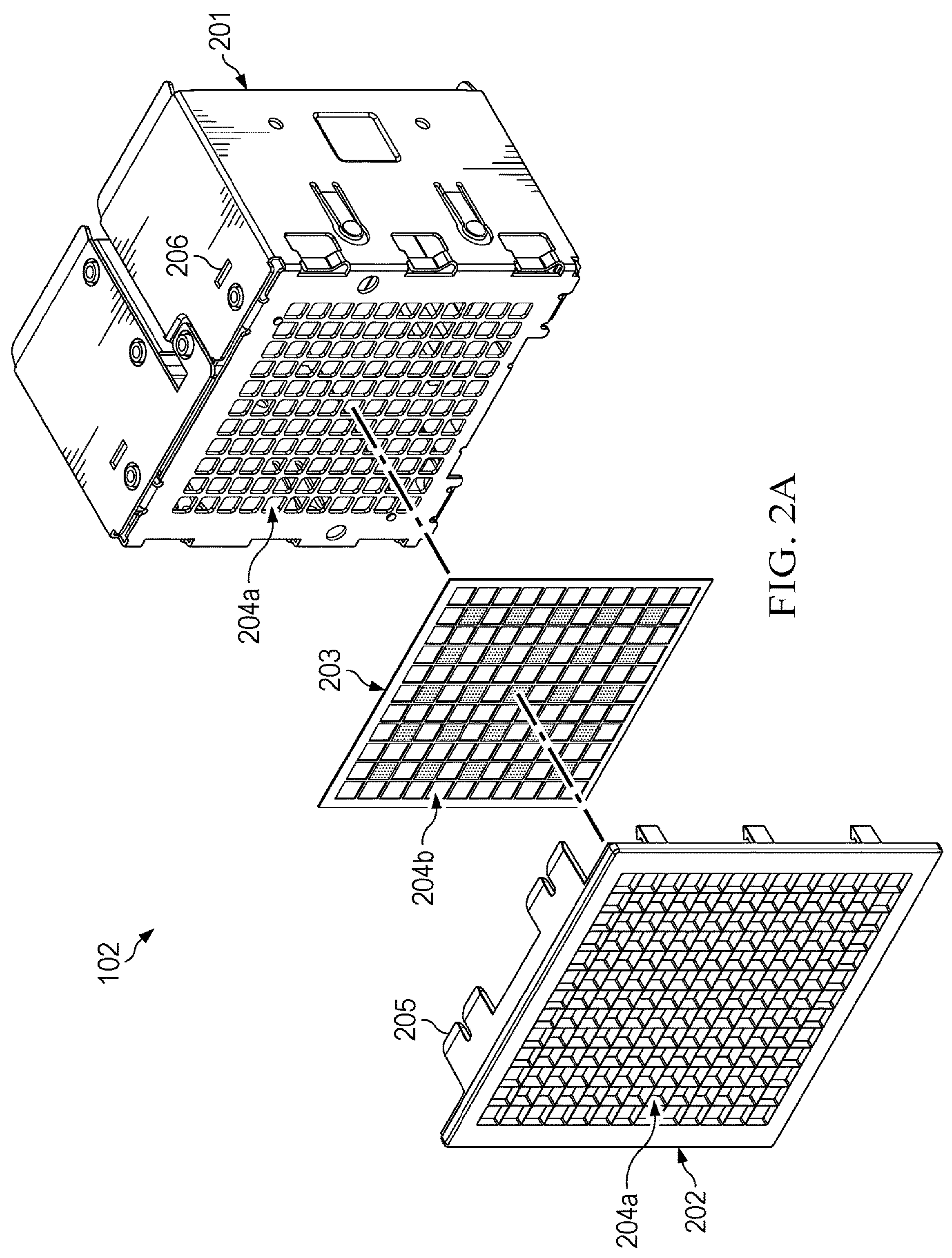
FIGS. 2A and 2B illustrate an exploded perspective view of example airflow impedance blanks with adjustable venting ratios, in accordance with embodiments of the present disclosure.
Figure 2B:
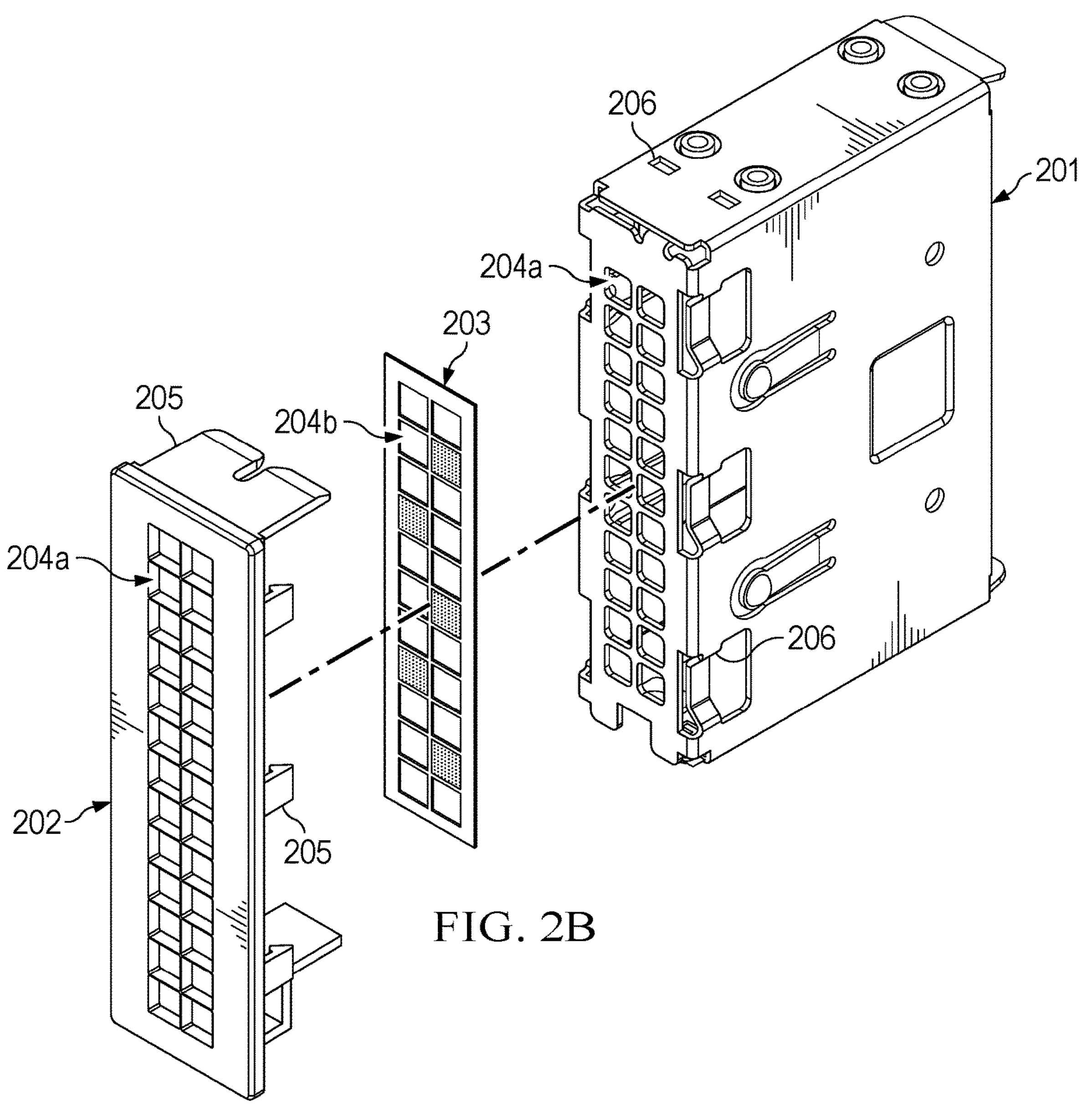

FIGS. 2A and 2B illustrate an exploded perspective view of example airflow impedance blanks 102 having adjustable venting ratios, in accordance with embodiments of the present disclosure. FIG. 2A depicts an example airflow impedance blank having a first form factor (e.g., that of an X8 storage resource), while FIG. 2B depicts an example airflow impedance blank having a second form factor (e.g., that of an X2 storage resource). While FIGS. 2A and 2B illustrate airflow impedance blanks 102 having two different form factors, airflow impedance blank 102 may have any suitable form factor.

As shown in FIGS. 2A and 2B, airflow impedance blank 102 may comprise a bracket 201, a removable frame 202, and a removable airflow impedance element 203. Bracket 201 and removable frame 202 may have a plurality of venting holes 204*a*, while removable airflow impedance element 203 may have a plurality of venting holes 204*b* (collectively, venting holes 204). The plurality of venting holes 204*b* may be less than or equal to the plurality of venting holes 204*a*. In some embodiments, bracket 201 may mechanically couple to removable frame 202 such that removable airflow impedance element 203 mechanically couples to and between bracket 201 and removable frame 202 and fluidically blocks airflow through one or more venting holes 204*a* of bracket 201 and removable frame 202.

Bracket 201 and removable frame 202 may mechanically couple through any suitable means. For example, as shown in FIGS. 2A and 2B and as further described below, bracket 201 and removable frame 202 may comprise a plurality of frame engagement features 206 and a plurality of bracket engagement features 205, respectively, each configured to mechanically engage with one another such that, when mechanically coupled, removable airflow impedance element 203 mechanically couples to and between bracket 201 and removable frame 202.

Bracket 201 and removable frame 202 may be configured to mechanically uncouple such that a first removable airflow impedance element 203 may be exchanged for a second removable airflow impedance element 203 having a different plurality of venting holes 204*b*. Although FIGS. 2A and 2B show the plurality of venting holes 204 of airflow impedance blank 102 as arranged in a grid, it is understood that the plurality of venting holes 204 may be arranged in any suitable configuration.

Bracket 201 be formed out of any suitable materials, including but not limited to metal. Removable frame 202 may be formed out of any suitable material, including but not limited to plastic. Removable airflow impedance element 203 may be formed out of any suitable material, including but not limited to plastic, and may further be transparent (e.g., biaxially-oriented polyethylene terephthalate, sometimes commonly referred to as "Mylar"). In some embodiments, removable airflow impedance element 203 may have a considerably sizable length and width, but an extremely thin depth, as would be the case where removable airflow impedance element 203 is implemented as a thin film. In some embodiments, removable airflow impedance element 203 may comprise a sticker or a decal.

Figure 2C:
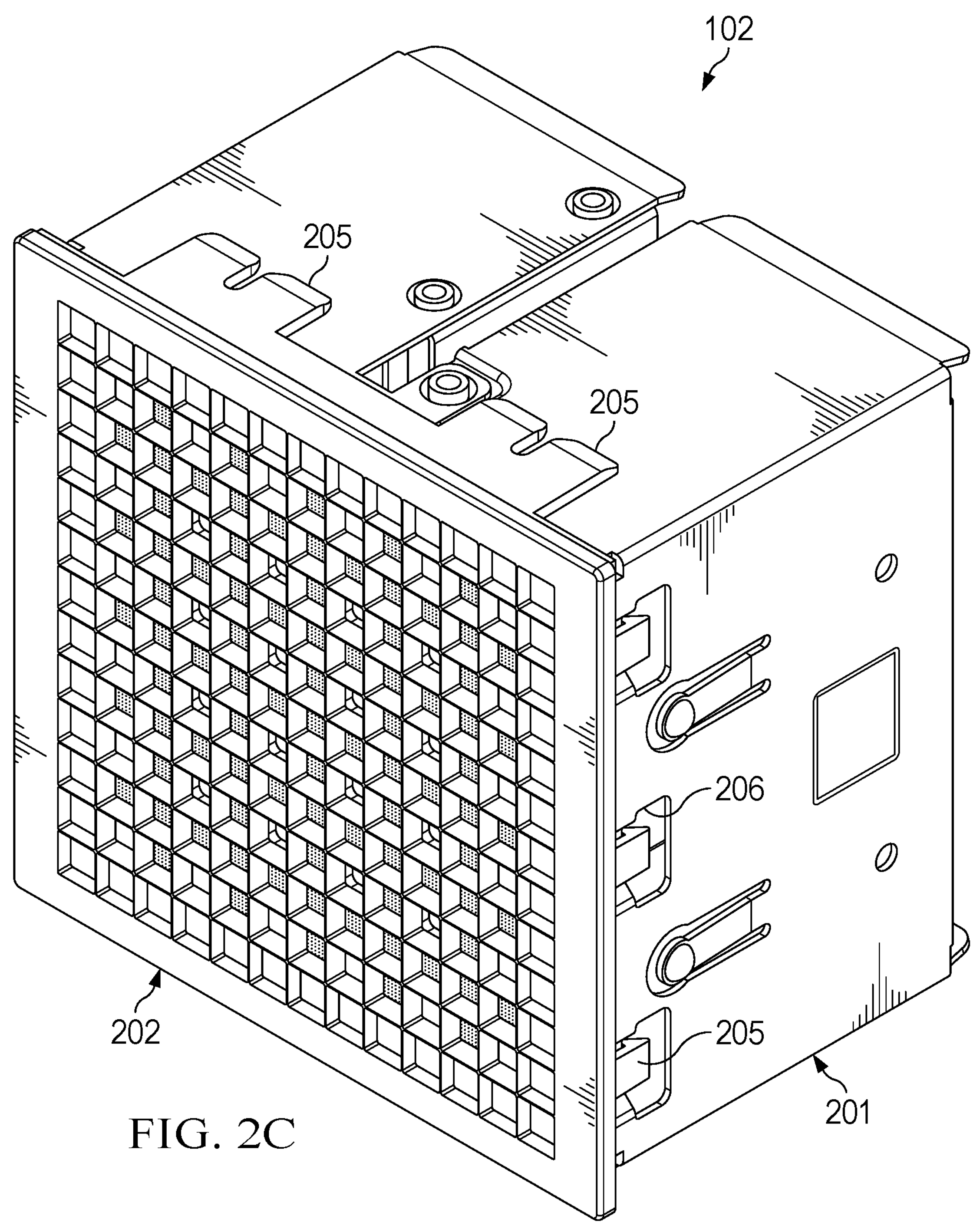
FIG. 2C illustrates an assembled perspective view of an example airflow impedance blank with an adjustable venting ratio, in accordance with embodiments of the present disclosure.

FIG. 2C illustrates an assembled perspective view of an example airflow impedance blank 102 having an adjustable venting ratio, in accordance with embodiments of the present disclosure. As shown in FIG. 2C, in some embodiments bracket 201 and removable frame 202 may mechanically couple to each other via bracket engagement features 205 and frame engagement features 206. In some embodiments, bracket engagement features 205 may comprise a plurality of protrusions configured to engage with frame engagement features 206, where the plurality of protrusions extend substantially perpendicular from removable frame 202. In some embodiments, frame engagement features 206 may comprise a plurality of recesses in bracket 201.

Figure 3A:
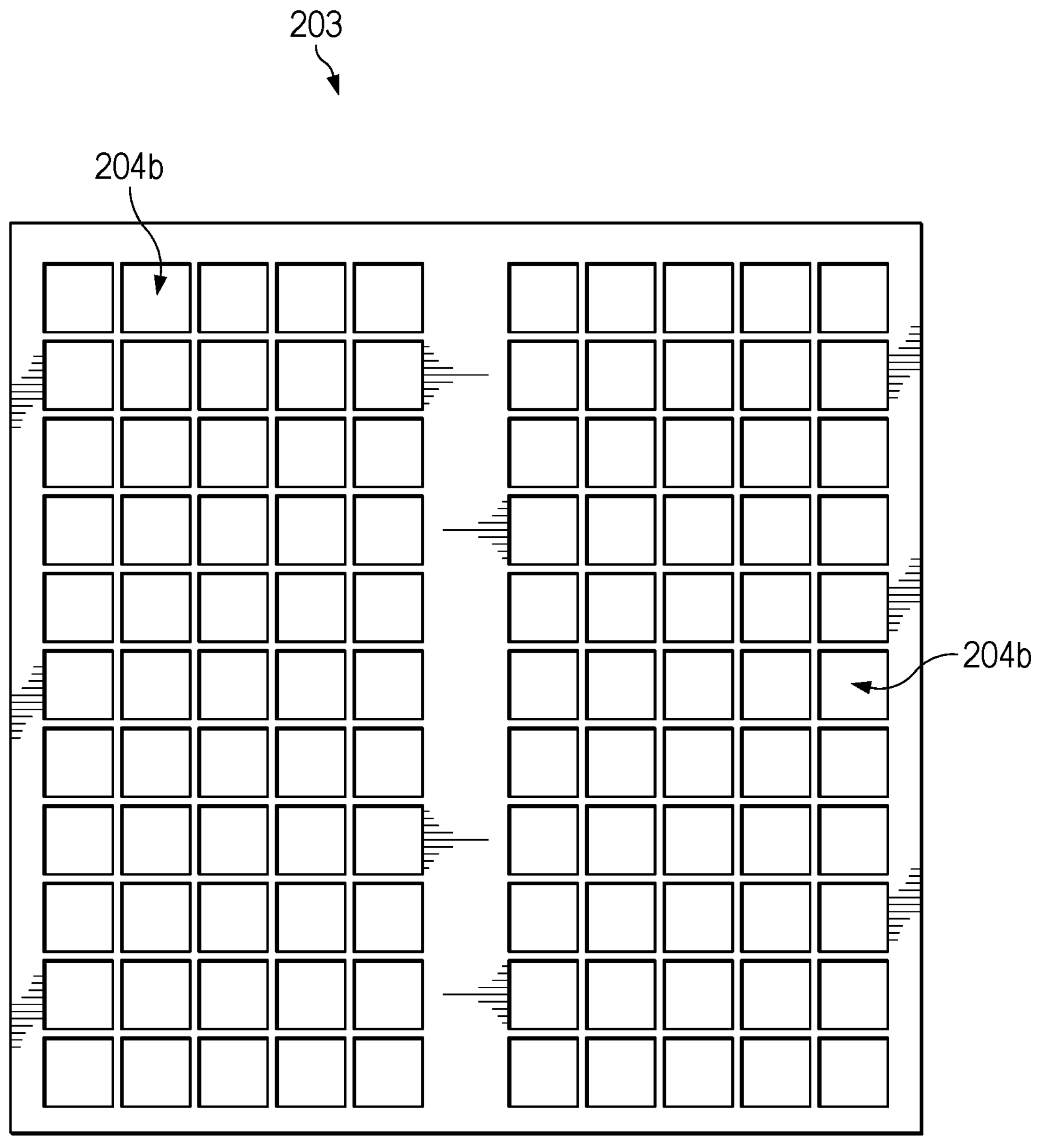
FIGS. 3A-3C illustrate elevation views of example removable airflow impedance elements with different venting ratios, in accordance with embodiments of the present disclosure.
Figure 3B:
Figure 3B:
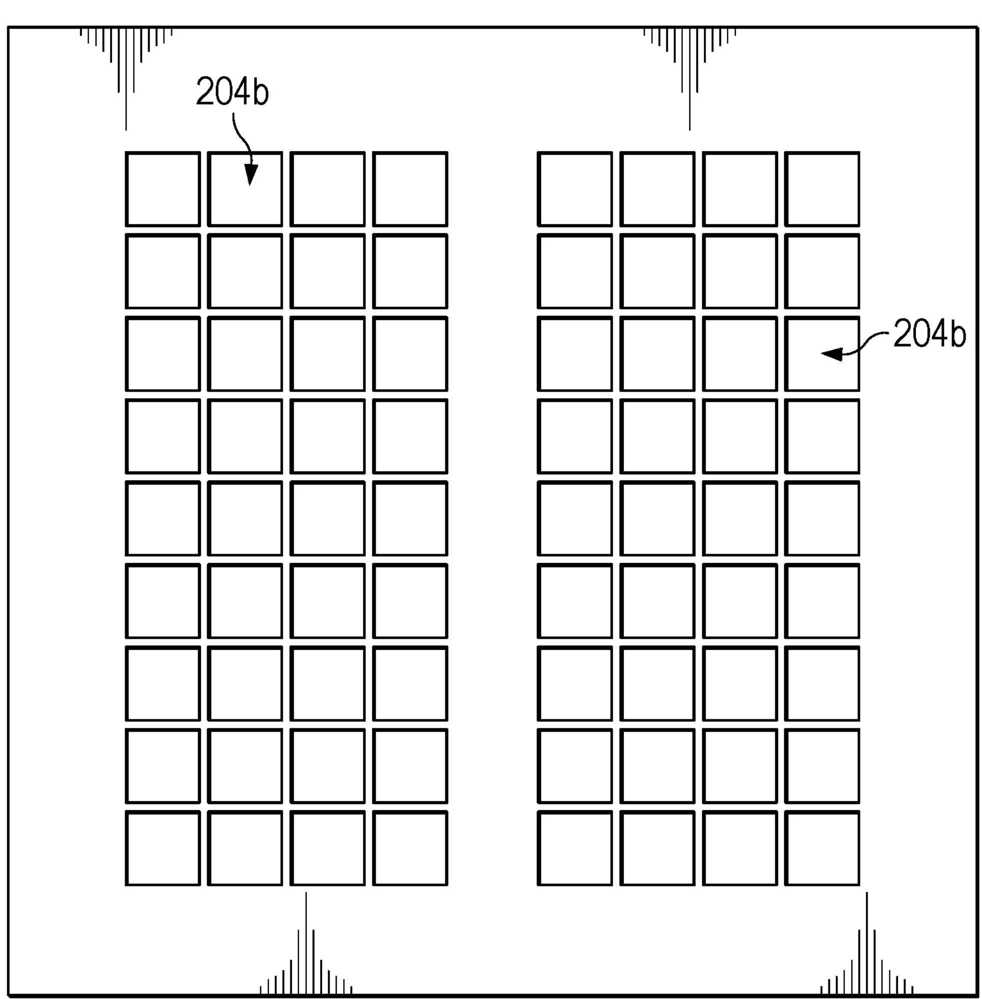
Figure 3C:
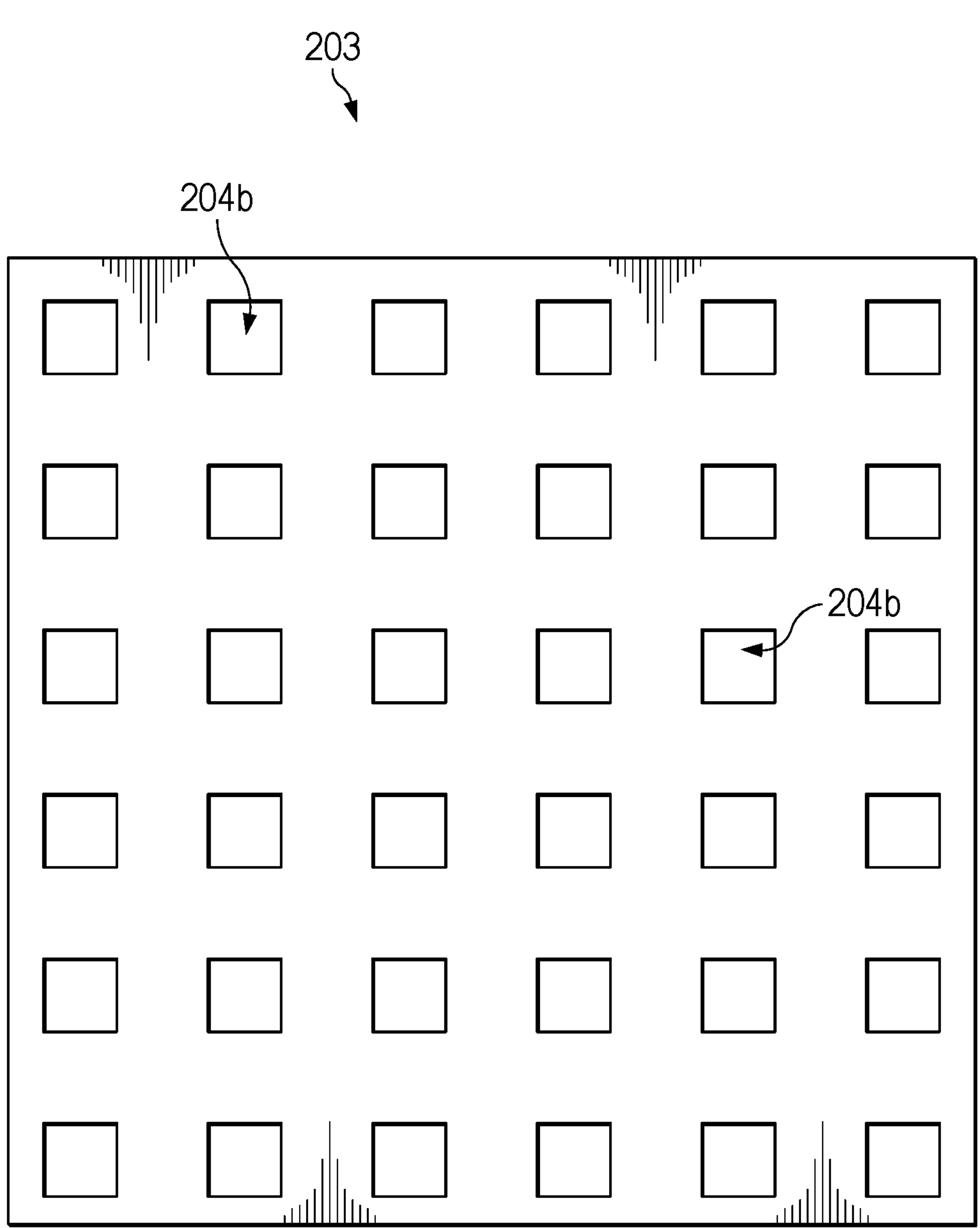

FIGS. 3A-3C illustrate elevation views of example removable airflow impedance elements 203 with different pluralities of venting holes 204*b*, in accordance with embodiments of the present disclosure. For example, FIG. 3A depicts a removable airflow impedance element 203 with 110 venting holes; FIG. 3B depicts a removable airflow impedance element 203 with 72 venting holes; and FIG. 3C depicts a removable airflow impedance element 203 with 36 venting holes. As shown in FIGS. 3A-3C, venting holes 204*b* may be arranged in any suitable pattern. And as explained above, the plurality of venting holes 204*b* of removable airflow impedance element 203 may be less than or equal to the plurality of venting holes 204*a* of bracket 201 and removable frame 202.

Figure 4A:
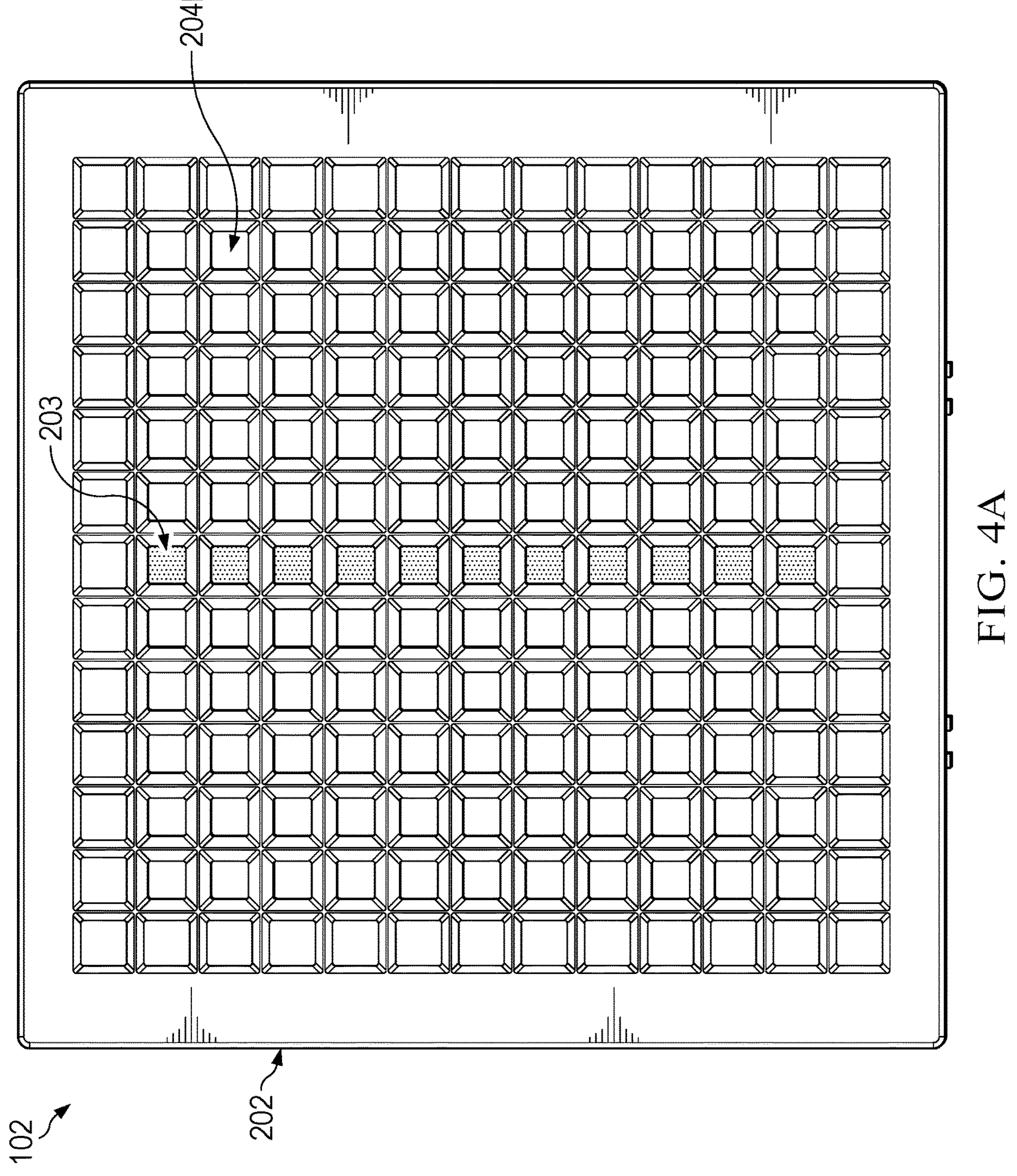
FIGS. 4A-4C illustrate elevation views of example airflow impedance blanks with different venting ratios, in accordance with embodiments of the present disclosure.
Figure 4B:
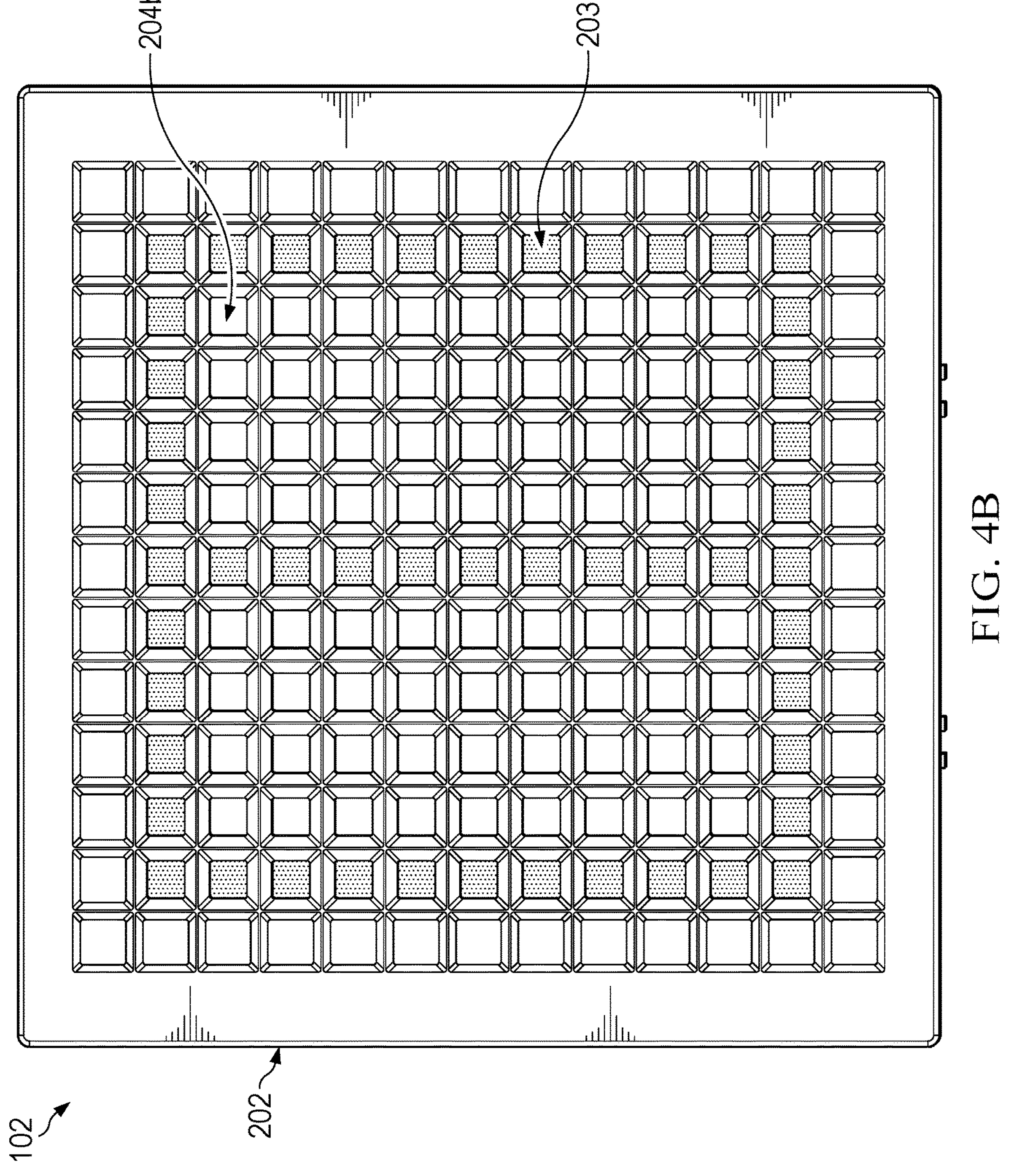
Figure 4C:
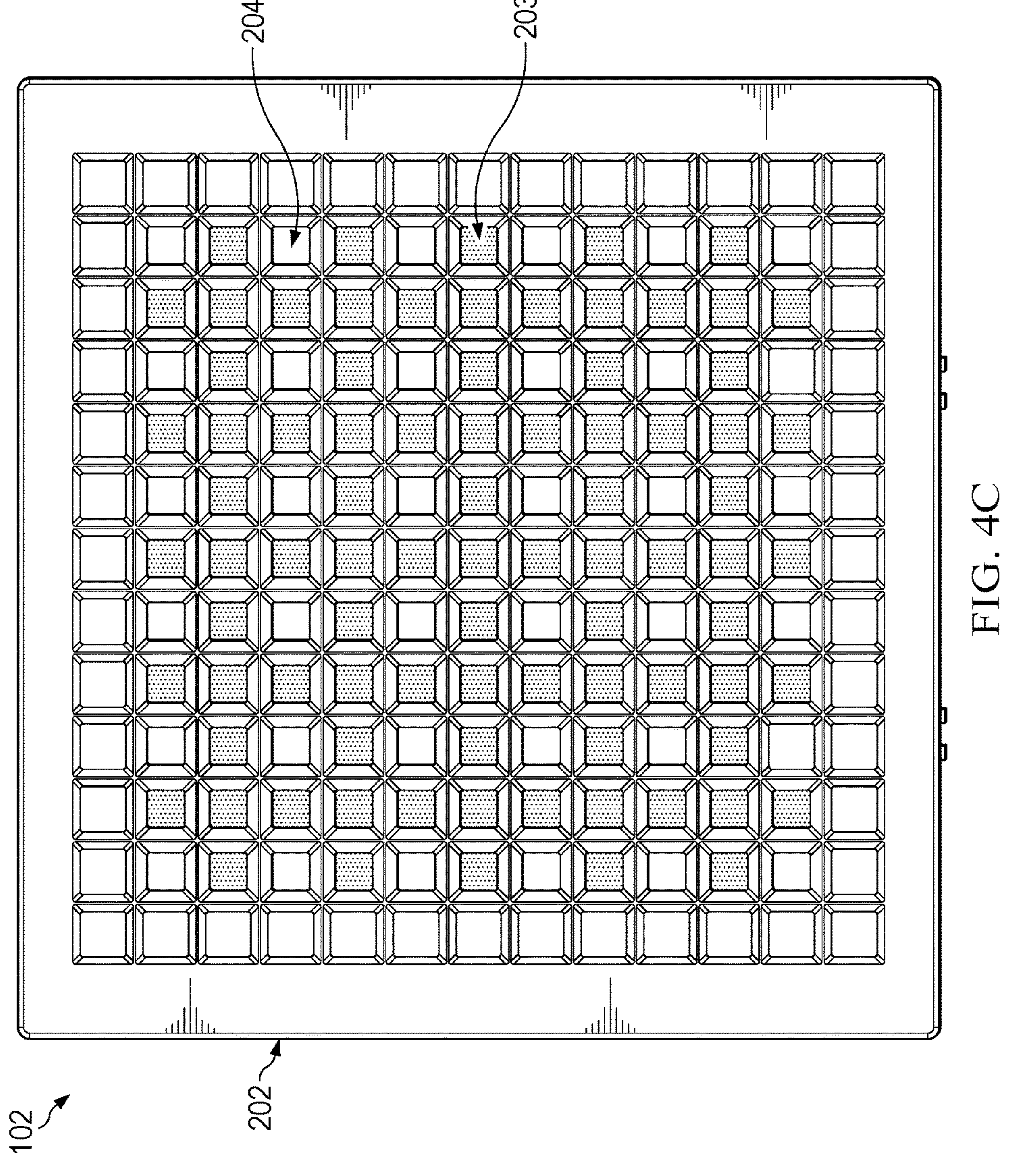

FIGS. 4A-4C illustrate elevation assembled views of example airflow impedance blanks 102 having different venting ratios, in accordance with embodiments of the present disclosure. For the purposes of this disclosure, the venting ratio may be represented by the plurality of venting holes 204*b* of removable airflow impedance element 203 relative to the plurality of venting holes 204*a* of bracket 201 and removable frame 202, such that the venting ratio increases as the plurality of venting holes 204*b* of removable airflow impedance element 203 increases (with a maximum ratio of 1) and vice-versa. For example, the airflow impedance blanks 102 of FIGS. 4A, 4B, and 4C comprise the removable airflow impedance elements 203 of FIGS. 3A, 3B, and 3C, respectively. Thus, the venting ratios of the airflow impedance blanks 102 of FIGS. 4A, 4B, and 4C are 110/121, 72/121, and 36/121, respectively.

While FIGS. 4A-4C depict airflow impedance blanks 102 having three different venting ratios, it is understood that airflow impedance blank 102 may have any suitable venting ratio.

One skilled in the art would appreciate that removable airflow impedance element 203 may mechanically couple to bracket 201 through any suitable means. For example, airflow impedance element 203 may be a decal or a sticker comprising an adhesive capable of adhering to bracket 201. In another example, removable frame 202 and bracket 201 may be mechanically coupled (permanently, in some embodiments) such that a "slot" is formed that is capable of receiving and having removed therefrom airflow impedance element 203.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any plurality of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. An airflow impedance blank interchangeable with an information handling resource configured to populate a slot of an information handling system, wherein the airflow impedance bank is configured to populate the slot of the information handling system and comprises:

a housing comprising a number of venting holes; and a removable airflow impedance element configured to couple to the housing and further configured to be readily exchanged for another removable airflow impedance element to adjust a venting ratio of the airflow impedance blank.

2. The airflow impedance blank of claim 1, wherein the removable airflow impedance element comprises a number of venting holes less than or equal to the number of venting holes of the housing.

3. The airflow impedance blank of claim 2, wherein the venting ratio comprises the number of venting holes of the removable airflow impedance element relative to the number of venting holes of the housing.

4. The airflow impedance blank of claim 1, wherein the removable airflow impedance element fluidically blocks airflow through one or more of the number of venting holes of the housing.

5. The airflow impedance blank of claim 1, wherein the housing further comprises:

a bracket; and a removable frame configured to mechanically couple to and uncouple from the bracket, such that when the removable frame and bracket are mechanically coupled, the removable airflow impedance element is mechanically coupled to and between the removable frame and the bracket.

6. The airflow impedance blank of claim 1, wherein the removable airflow impedance element comprises a transparent film.

7. The airflow impedance blank of claim 1, wherein the removable airflow impedance element comprises an adhesive for coupling to the housing.

8. An information handling system comprising:

a chassis; and an airflow impedance blank interchangeable with an information handling resource configured to populate a slot of the information handling system, wherein the airflow impedance blank is configured to populate the slot of the information handling system and comprises:

a housing comprising a number of venting holes; and a removable airflow impedance element configured to couple to the housing and further configured to be readily exchanged for another removable airflow impedance element to adjust a venting ratio of the airflow impedance blank.

9. The information handling system of claim 8, wherein the removable airflow impedance element fluidically blocks airflow through one or more of the number of venting holes of the housing.

10. The airflow impedance blank of claim 9, wherein the venting ratio comprises the number of venting holes of the removable airflow impedance element relative to the number of venting holes of the housing.

11. The airflow impedance blank of claim 8, wherein the removable airflow impedance element fluidically blocks airflow through one or more of the number of venting holes of the housing.

12. The information handling system of claim 8, wherein the housing further comprises:

a bracket; and a removable frame configured to mechanically couple to and uncouple from the bracket, such that when the removable frame and bracket are mechanically coupled, the removable airflow impedance element is mechanically coupled to and between the removable frame and the bracket.

13. The information handling system of claim 8, wherein the removable airflow impedance element comprises a transparent film.

14. The information handling system of claim 8, wherein the removable airflow impedance element comprises an adhesive for coupling to the housing.

15. A method for forming an airflow impedance blank interchangeable with an information handling resource configured to populate a slot of an information handling system, wherein the airflow impedance blank is configured to populate the slot of the information handling system, the method comprising:

coupling a removable airflow impedance element to a housing comprising a number of venting holes, wherein the removable airflow element is configured to be readily exchanged for another removable airflow impedance element to adjust a venting ratio of the airflow impedance blank.

16. The method of claim 15, wherein the removable airflow impedance element fluidically blocks airflow through one or more of the number of venting holes of the housing.

17. The method of claim 16, wherein the venting ratio comprises the number of venting holes of the removable airflow impedance element relative to the number of venting holes of the housing.

18. The method of claim 15, wherein the removable airflow impedance element fluidically blocks airflow through one or more of the number of venting holes of the housing.

19. The method of claim 15, wherein the housing further comprises:

a bracket; and a removable frame configured to mechanically couple to and uncouple from the bracket, such that when the removable frame and bracket are mechanically coupled, the removable airflow impedance element is mechanically coupled to and between the removable frame and the bracket.

20. The method of claim 15, wherein the removable airflow impedance element comprises a transparent film.

* * * * *